(12) United States Patent  
Kim (10) Patent No.: US 10,629,444 B2  
(45) Date of Patent: Apr. 21, 2020

(54) METHOD FOR MANUFACTURING BUMP STRUCTURE

(71) Applicant: LBSEMICON CO., LTD., Gyeonggi-do (KR)

(72) Inventor: Young Gu Kim, Gyeonggi-do (KR)

(73) Assignee: LBSEMICON CO., LTD., Gyeonggi-Do (KR)

( * ) Notice: Subject to any disclaimer, the term of this patent is extended or adjusted under 35 U.S.C. 154(b) by 305 days.

(21) Appl. No.: 15/735,219

(22) PCT Filed: Jun. 9, 2016

(86) PCT No.: PCT/KR2016/006086  
§ 371 (c)(1),  
(2) Date: Dec. 11, 2017

(87) PCT Pub. No.: WO2016/200157  
PCT Pub. Date: Dec. 15, 2016

(65) Prior Publication Data  
US 2018/0166284 A1 Jun. 14, 2018

(30) Foreign Application Priority Data  
Jun. 11, 2015 (KR) .......................... 10-2015-0082637

(51) Int. Cl.  
*H01L 21/288* (2006.01)  
*H01L 23/488* (2006.01)  
(Continued)

(52) U.S. Cl.  
CPC ........ *H01L 21/288* (2013.01); *C23C 18/1633* (2013.01); *C25D 3/48* (2013.01);  
(Continued)

(58) Field of Classification Search  
CPC ..... H01L 21/288; H01L 23/00; H01L 23/488; H01L 2224/11; H01L 24/11; H01L 24/13;  
(Continued)

(56) References Cited

U.S. PATENT DOCUMENTS

| 2003/0134050 A1* | 7/2003 | Kunishi | ................. | C23C 18/31 427/443.1 |
| 2004/0166661 A1* | 8/2004 | Lei | .......................... | H01L 24/03 438/614 |

(Continued)

FOREIGN PATENT DOCUMENTS

| JP | 2005-123294 | 5/2005 |
| KR | 10-1994-0024944 | 12/1999 |

(Continued)

*Primary Examiner* — Caleen O Sullivan  
(74) *Attorney, Agent, or Firm* — Stuart H. Mayer; Mayer & Willams PC (57) ABSTRACT

The present invention relates to a method for manufacturing a bump structure capable of enhancing adhesion, comprising the steps of: forming an under bump metal (UBM) layer on a conductive pad; forming a copper bump on the UBM layer by electrolytic plating; forming a nickel bump on the copper bump by electrolytic plating; forming a first gold bump on the nickel bump by electrolytic plating using a first gold plating solution; and forming a second gold bump on the first gold bump by electrolytic plating using a second gold plating solution, wherein the second gold plating solution contains thallium (Tl) and the first gold plating solution is free of thallium.

16 Claims, 7 Drawing Sheets

(51) Int. Cl.
*C25D 7/12* (2006.01)
*C25D 17/00* (2006.01)
*C23C 18/16* (2006.01)
*H01L 23/00* (2006.01)
*C25D 5/12* (2006.01)
*C25D 3/48* (2006.01)

(52) U.S. Cl.
CPC ............... *C25D 5/12* (2013.01); *C25D 7/123* (2013.01); *C25D 17/001* (2013.01); *H01L 23/00* (2013.01); *H01L 23/488* (2013.01); *H01L 24/11* (2013.01); *H01L 24/13* (2013.01); *H01L 2224/03912* (2013.01); *H01L 2224/0401* (2013.01); *H01L 2224/05022* (2013.01); *H01L 2224/05166* (2013.01); *H01L 2224/05572* (2013.01); *H01L 2224/05582* (2013.01); *H01L 2224/05647* (2013.01); *H01L 2224/11* (2013.01); *H01L 2224/1147* (2013.01); *H01L 2224/11462* (2013.01); *H01L 2224/13084* (2013.01); *H01L 2224/13144* (2013.01); *H01L 2224/13147* (2013.01); *H01L 2224/13155* (2013.01); *H01L 2224/94* (2013.01)

(58) Field of Classification Search
CPC ......... H01L 2224/1147; H01L 2224/94; H01L 2224/13084; H01L 2224/03912; H01L 2224/13147; H01L 2224/11462; H01L 2224/05166; H01L 2224/13155; H01L 2224/05647; H01L 2224/13144; H01L 2224/05582; H01L 2224/0401; H01L 2224/05022; H01L 2224/05572; H01L 2924/00014; H01L 2924/01079; C25D 17/001; C25D 7/123; C25D 5/12; C25D 3/48; C23C 18/1633
USPC ........................................................ 438/613
See application file for complete search history.

(56) References Cited

U.S. PATENT DOCUMENTS

| | | | |
|---|---|---|---|
| 2011/0117736 A1* | 5/2011 | Kanaoka | C25D 3/48 438/613 |
| 2011/0260317 A1* | 10/2011 | Lu | H01L 24/11 257/737 |

FOREIGN PATENT DOCUMENTS

| | | |
|---|---|---|
| KR | 100809706 | 3/2008 |
| KR | 10-2013-0051571 | 5/2013 |
| KR | 10-2015-0020686 | 2/2015 |

* cited by examiner

Au blister

FIG. 3B

Au peeling

METHOD FOR MANUFACTURING BUMP STRUCTURE

TECHNICAL FIELD

The present invention relates to a method for manufacturing a bump structure and, more particularly, to a method for manufacturing a laminated bump structure.

BACKGROUND ART

Bumps having a multilayered structure have received great attention as a next-generation bump structure capable of replacing a gold bump in a display driver IC package or the like, because of their low manufacturing costs and excellent heat dissipation characteristics. Also, development of semiconductor element packages has been actively conducted because of low resistance characteristics of copper.

The prior art related to the present invention is disclosed in Korean Patent Publication No. 1994-0024944 (Publication date: Nov. 19, 1994, and Title: Method of fabricating bump structure).

DISCLOSURE OF THE INVENTION

Technical Problem

An object of the present invention is to provide a method for manufacturing a laminated bump structure with high adhesion characteristics by minimizing formation of a coating caused by a substitution reaction at an interface between nickel and gold. However, this may be merely illustrative, and thus the scope of the present invention is not limited thereby.

Technical Solution

A method for manufacturing a bump structure according to an aspect of the present invention includes the steps of: forming an under bump metal (UBM) layer on a conductive pad; forming a copper bump on the UBM layer by electrolytic plating; forming a nickel bump on the copper bump by electrolytic plating; forming a first gold bump on the nickel bump by electrolytic plating using a first gold plating solution; and forming a second gold bump on the first gold bump by electrolytic plating using a second gold plating solution, wherein the second gold plating solution contains thallium (Tl) and the first gold plating solution is free of thallium.

In the method for manufacturing the bump structure, a thallium content of the second gold plating solution may range from 3 mg/L to 6 mg/L when the second gold plating solution contains $[Au(CN)_2]^-$; and a thallium content of the second gold plating solution may range from 3 mg/L to 25 mg/L when the second gold plating solution contains $[Au(SO_3)_2]^{3-}$.

A method for manufacturing a bump structure according to another aspect of the present invention includes the steps of: forming an under bump metal (UBM) layer on a conductive pad; forming a copper bump on the UBM layer by electrolytic plating; forming a nickel bump on the copper bump by electrolytic plating; forming a first gold bump on the nickel bump by electrolytic plating using a first gold plating solution; and forming a second gold bump on the first gold bump by electrolytic plating using a second gold plating solution, wherein a thallium (Tl) content of the second gold plating solution is higher than a thallium content of the first gold plating solution.

In the method for manufacturing the bump structure, a thallium content of the first gold plating solution may be greater than 0 mg/L and equal to or less than 2 mg/L when the first gold plating solution contains $[Au(CN)_2]^-$; a thallium content of the first gold plating solution may be greater than 0 mg/L and equal to or less than 2 mg/L when the first gold plating solution contains $[Au(SO_3)_2]^{3-}$; a thallium content of the second gold plating solution may range from 3 mg/L and 6 mg/L when the second gold plating solution contains $[Au(CN)_2]^-$; and a thallium content of the second gold plating solution may range from 3 mg/L and 25 mg/L when the second gold plating solution contains $[Au(SO_3)_2]^{3-}$.

In the methods for manufacturing the bump structure, a gold content of the second gold plating solution may be higher than a gold content of the first gold plating solution.

In the methods for manufacturing the bump structure, a gold content of the first gold plating solution may range from 1 g/L to 4 g/L when the first gold plating solution contains $[Au(CN)_2]^-$; a gold content of the first gold plating solution may range from 1 g/L to 4 g/L when the first gold plating solution contains $[Au(SO_3)_2]^{3-}$; a gold content of the second gold plating solution may range from g/L to 10 g/L when the second gold plating solution contains $[Au(CN)_2]^-$; and a gold content of the second gold plating solution may range from 10 g/L to 15 g/L when the second gold plating solution contains $[Au(SO_3)_2]^{3-}$.

In the methods for manufacturing the bump structure, a temperature of electrolytic plating using the first gold plating solution may be lower than a temperature of electrolytic plating using the second gold plating solution.

In the methods for manufacturing the bump structure, a temperature of electrolytic plating using the first gold plating solution may range from 30° C. to 45° C., and a temperature of electrolytic plating using the second gold plating solution may range from 40° C. to 60° C.

In the methods for manufacturing the bump structure, the UBM layer may include a Ti layer and a Cu layer on the Ti layer, or may include a TiW layer and a Cu layer on the TiW layer.

In the methods for manufacturing the bump structure, the copper bump may have a height ranging from 1 µm to 20 µm, the nickel bump may have a height ranging from 0.1 µm to 5 µm, and the first gold bump may have a height ranging from 0.05 µm to 1 µm.

Advantageous Effects

According to embodiments of the present invention, the multilayered bump structure with high adhesion characteristics may be embodied by minimizing the formation of the coating caused by the substitution reaction at the interface between nickel and gold. However, the range of the present invention is not limited to the above-described effects.

MODE FOR CARRYING OUT THE INVENTION

Hereinafter, several preferred embodiments of the present invention will be described in detail with reference to the accompanying drawings.

Embodiments of the present invention are provided to explain the present invention more completely to those skilled in the art to which the present invention pertains, and the following embodiments may be modified in many different forms and should not be construed as limiting the scope of the present invention. Rather, these embodiments are provided so that this disclosure will be thorough and complete, and will fully convey the spirit of the present disclosure to those skilled in the art. Also, in the figures, a thickness or dimension of each of layers is exaggerated for convenience and clarity of illustration.

Figure 1:
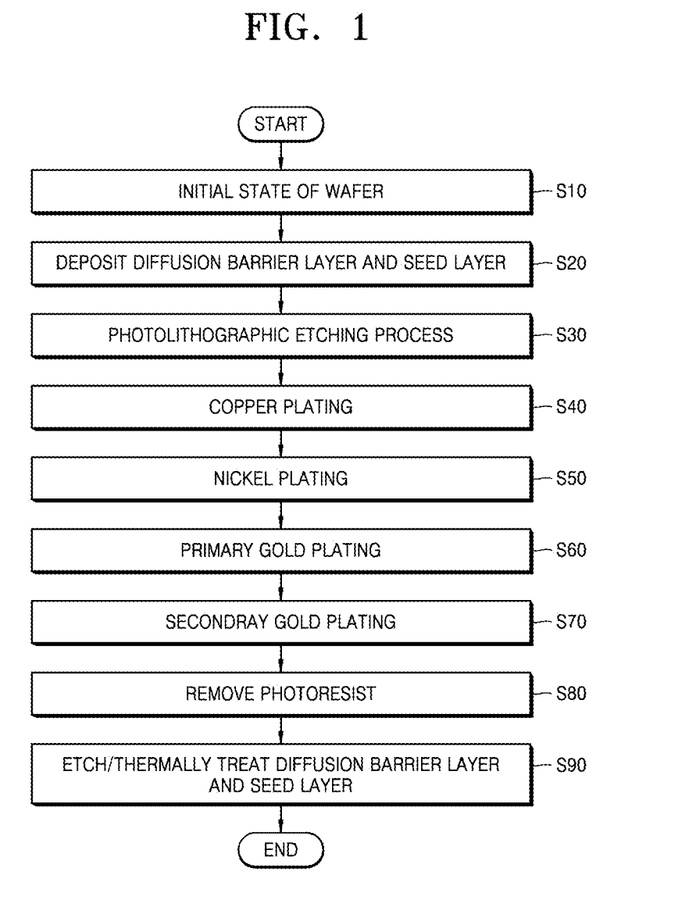
FIG. 1 is a flowchart illustrating a method for manufacturing a bump structure according to an embodiment of the present invention.

FIG. 1 is a flowchart illustrating a method for manufacturing a bump structure according to an embodiment of the present invention, and FIGS. 2A to 2J are cross-sectional views sequentially illustrating a method for manufacturing a bump structure according to an embodiment of the present invention.

Figure 2A:
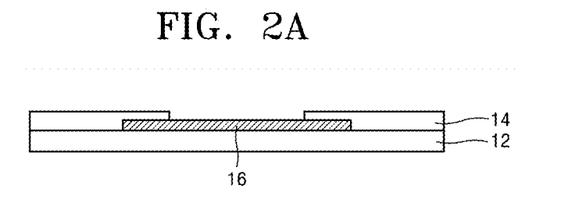
FIGS. 2A to 2J are cross-sectional views sequentially illustrating a method for manufacturing a bump structure according to an embodiment of the present invention.
Figure 2B:
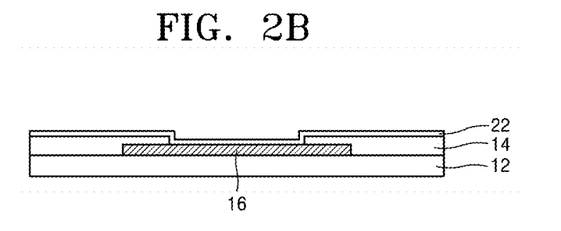
Figure 2C:
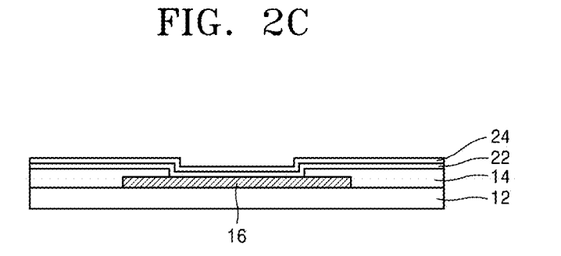
Figure 2D:
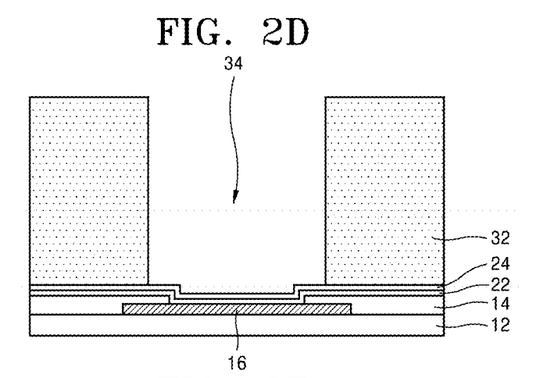
Figure 2E:
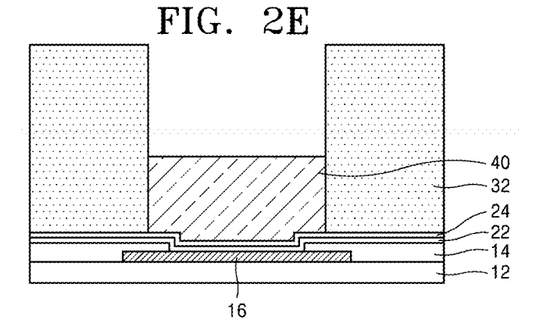
Figure 2F:
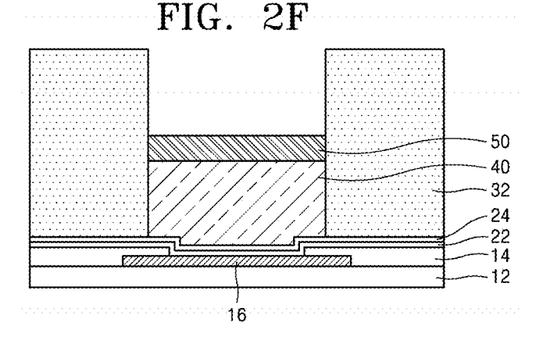
Figure 2G:
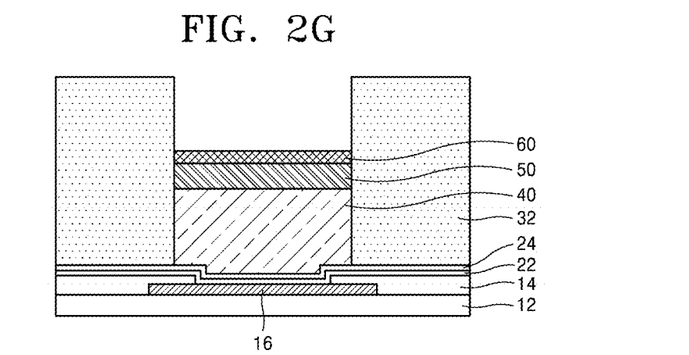
Figure 2H:
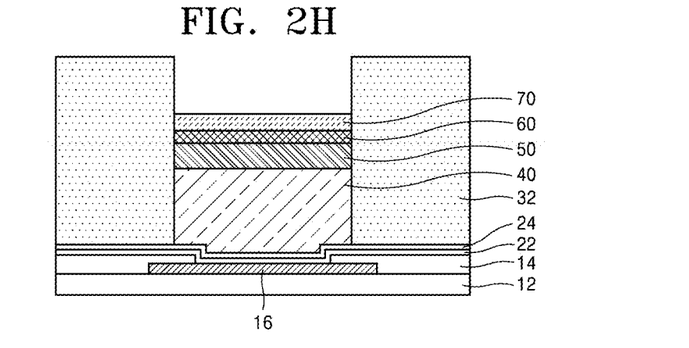
Figure 2I:
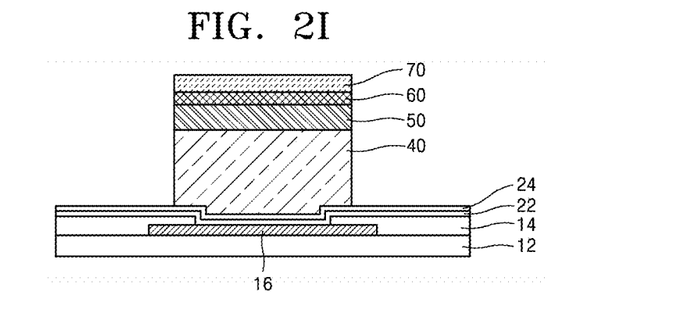
Figure 2J:
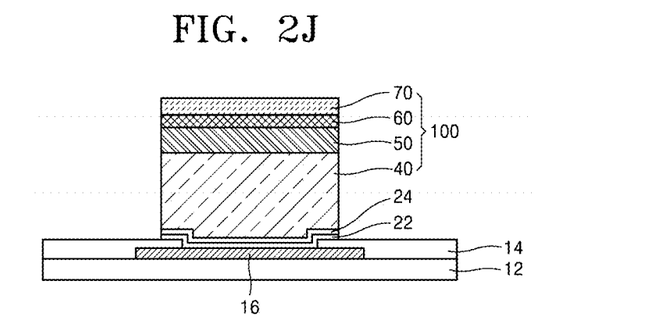

Referring to FIGS. 1 to 2J, a method for manufacturing a bump structure according to an embodiment of the present invention includes the steps of: preparing a wafer 12 provided with a conductive pad 16 (S10); forming an under bump metal (UBM) layer 22 and 24 on the conductive pad 16 (S20); performing a photolithographic etching process to form a photoresist pattern 32 that provides an opening 34 above the conductive pad 16 (S30); forming a copper bump 40 on the UBM layer 22 and 24 in the opening 34 by electrolytic plating (S40); forming a nickel bump 50 on the copper bump 40 by electrolytic plating (S50); forming a first gold bump 60 on the nickel bump 50 by electrolytic plating using a first gold plating solution (S60); forming a second gold bump 70 on the first gold bump 60 by electrolytic plating using a second gold plating solution (S70); removing the photoresist pattern 32 (S80); and etching the exposed UBM layer 22 and 24 (S90).

A Cu/Ni/Au (CNA) bump having a multilayered structure may become a next-generation bump structure capable of replacing a gold bump in a display driver IC package, because of its low manufacturing costs and excellent heat dissipation characteristics, and also may be applied to a semiconductor element package using the CNA bump because of low resistance characteristics of copper.

A method for manufacturing the Cu/Ni/Au (CNA) bump may be preformed by using both electrolytic plating and electroless plating or using only electrolytic plating. When both electrolytic plating and electroless plating are used, the method may be divided into two cases: a method in which copper is formed by electrolytic plating and then nickel and gold are formed by electroless plating; and a method in which copper and nickel are formed by electrolytic plating and then only gold that is a capping metal is formed by electroless plating. In electroless plating, however, since a thickness of metal that can be laminated is limited to 1 μm or less due to the characteristics of the electrolytic plating, there may be a limitation in controlling the thickness of each layer so as to be suitable to characteristics required in a package such as COG, COF, QFN, or the like. In addition, since a complex pretreatment process is required, the electroless plating may be less competitive than the electrolytic plating in aspects of a competitive price and mass production.

Figure 3A:
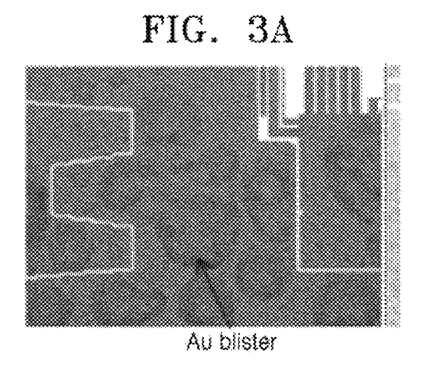
FIGS. 3A and 3B are images showing problems due to deterioration of gold adhesion in a bump structure according to a comparative example of the present invention.
Figure 3B:
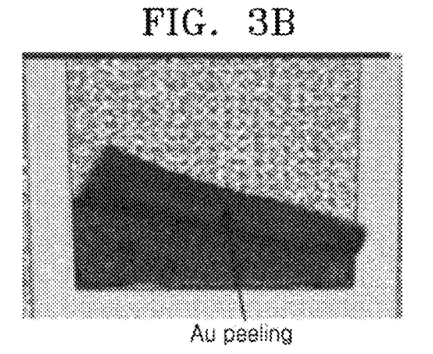

Therefore, in manufacturing the CNA bump, a method in which all of the gold, nickel, and gold are formed by the electrolytic plating may be introduced. In the case of gold, however, a reduction potential is low, and in a pre-flow step that is a process before electricity is applied during gold electrolytic plating, a thin gold electroless plating layer may be formed on a nickel surface due to the substitution reaction between nickel in a lower layer and gold ions in a gold plating solution. Also, such electroless plated gold may be easily delaminated from the a nickel metal layer due to weak adhesion to nickel, and thus critical quality issues may occur in product reliability and a manufacturing process. In FIGS. 3A and 3B, a defect of a product caused by such adhesion deterioration may be identified. Particularly, a gold blister phenomenon may be identified in FIG. 3A, and a gold peeling phenomenon may be identified in FIG. 3B.

In order to manufacture a CNA bump with high adhesion characteristics in forming Cu, Ni, and Au by the electrolytic plating, a method for manufacturing the bump structure according to the present invention provides a method for minimizing a coating formed on a nickel surface of lower portion thereof during the gold electrolytic plating, caused by the electroless gold substitution reaction.

In a method for manufacturing the bump structure according to an embodiment of the present invention, there is a provided a method in which the gold bump is formed by being laminated in two stages using two kinds of gold plating solutions to thereby manufacture the CNA bump with the high adhesion characteristics. Particularly, through primarily performing gold strike plating at a low temperature of 50° C. or less using a gold electrolytic plating solution without thallium(Tl) so as to restrict the substitution reaction after the nickel electrolytic plating, a gold coating is first formed on the nickel surface, wherein the gold coating has a thickness of 0.05 μm to 1 μm with the high adhesion characteristics. In the case of a gold bump plating solution for a general semiconductor, thallium (Tl) is contained as a crystal-controlling agent. It is proved that this thallium (Tl) acts to promote the substitution reaction of nickel and gold ions, and thus causes interfacial adhesion to be deteriorated, in laminating two kinds of metals having a large potential difference by the electrolytic plating.

Since there is no thallium (Tl) in the gold strike plating solution used in the method for manufacturing the gold bump structure of the embodiment of the present invention, the adhesion property may be enhanced, which is an issue in the above-described process. By applying the gold bump plating solution including Tl for the general semiconductor on the primarily coated gold coating, a secondary gold plating is performed to finally form a gold pump having a desired thickness.

Hereinafter, an exemplary method for manufacturing the gold bump of the present invention will be described in detail. This manufacturing method is a method for forming a gold bump having a multilayered structure, so as to assemble a microelectronic device chip, which includes a final metal pad 16 for electrical connection to an external circuit and a passivation layer 14 for protecting the final metal pad 16, to the uppermost of a microcircuit. In this case, the configuration of the laminated metal bump is Cu/Ni/Au.

The height of the copper constituting the metal bump may be adjusted to have a suitable height, depending on electrical resistance characteristics required in corresponding products, or package types (COG, COF, or wire bonding) to which the CNA bump is intended to be applied. The nickel acts to suppress the formation of intermetallic compound between the copper and the gold that is a capping metal of the outermost layer, in a heat treatment process for controlling hardness or an assembling process during the bump forming process. Also the gold of the outermost layer is bonded to ITO or a Cu/Sn lead when COG and COG package are performed, or is bonded to an Au wire or a Cu wire when a wire bonding type package such as QFN is performed, to thereby act to electrically connect a substrate and IC. The method for forming the CNA bump with high adhesion characteristics by electroplating will be described below.

First, in order to form a bump by electroplating, an USM layer including a diffusion barrier layer 22 and a seed layer 24 is first deposited on a microelectronic device chip by sputtering. The diffusion barrier layer 22 may include TiW or Ti, and the seed layer 24 may include Cu. In this case, the copper (Cu) is a seed layer for electrolytic plating, and TiW or Ti is intended to act as a diffusion barrier layer for preventing diffusion between the copper seed layer and a final metal pad of aluminum alloy during a heat treatment process and a package process.

Then, a photoresist 32 is applied on the microelectronic device chip, and then an opening 34 is formed, through a photolithographic etching process, at only a region above a final metal pad 16 where the bump is to be formed. Here, the remaining region maintains a state in which the photoresist 32 is applied.

Then, a copper bump 40 with a thickness of 1 to 20 μm is first filled in the formed opening 34 by the electrolytic plating. Subsequently, nickel is plated, at a thickness of 0.1 to 5 μm, on the copper bump 40 formed by the electrolytic plating. A pretreatment process (pickling process) using an acidic chemical may be performed so as to remove an oxide film on the copper seed layer before copper and nickel plating, and on the plated copper surface. Then, in order to enhance adhesion between gold and nickel before gold plating, a gold coating layer 70 is formed at a thickness of 0.05 to 1 μm on the plated nickel surface by using a gold strike plating solution. The gold strike plating solution used in this case refers to a cyanide or non-cyanide type of gold plating solution without thallium (Tl), and the plating is characterized by being performed with the plating solution having a low temperature of 45° C. or less so as to suppress the substitution reaction during the gold strike plating.

Then, gold plating is secondarily performed on the thinly plated strike plating layer at the target height required by each package type. In this case, a cyanide or non-cyanide type of gold plating solution with thallium (Tl), which is generally used for semiconductor, may be used as the plating solution.

Table 1 shows main compositions and a plating process, by comparing them in the first gold plating solution (gold strike plating solution) and the second gold plating solution (bump gold plating solution for semiconductor) described above.

TABLE 1

|  | First gold plating solution | First gold plating solution | Second gold plating solution | Second gold plating solution |
| --- | --- | --- | --- | --- |
| Type of plating solution | CN-based plating solution $[Au(CN)_2]^-$ | NCN-based plating solution $[Au(SO_3)^2]^{3-}$ | CN-based plating solution $[Au(CN)_2]^-$ | NCN-based plating solution $[Au(SO_3)_2]^{3-}$ |
| Gold concentration | 1-4 g/L | 1-4 g/L | 4-10 g/L | 10-15 g/L |
| pH | 5-7 | 7-8.5 | 5-7 | 7-8.5 |
| Crystal adjusting agent | Thallium: 0-2 mg/L | Thallium: 0-2 mg/L | Thallium: 3-6 mg/L | Thallium: 3-25 mg/L |
| Current density | 0.1-0.5 ASD | 0.1-0.5 ASD | 0.2-0.8 ASD | 0.2-0.8 ASD |
| Temperature range of plating solution | 30-45° C. | 30-45° C. | 40-60° C. | 40-60° C. |

Next, after the gold electrolytic plating, the photoresist, the seed layer, and the diffusion barrier layer are removed successively by using a photoresist stripper chemical, and Cu, Ti, or TiW etching solution. Finally, after etching, a heat treatment (annealing) process may be selectively performed for a predetermined time so as to adjust hardness of the bump depending on the package type of the product.

Figure 4A:
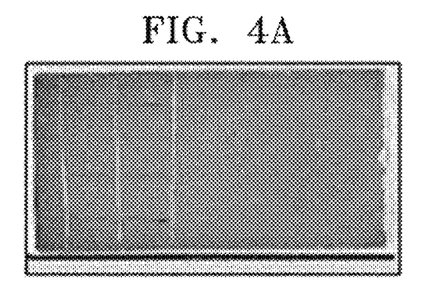
FIGS. 4A and 4B are images showing results of a scratch test in bump structures according to an embodiment and a comparative example of the present invention.
Figure 4B:
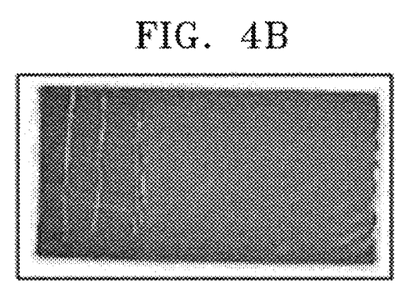

FIGS. 4A and 4B are images showing results of a scratch test in the bump structures according to an embodiment and a comparative example of the present invention.

Referring to FIG. 4A, it shows a result of the scratch test for the bump structure embodied according to the embodiment of the present invention in which the gold strike plating is applied, it may be observed that the gold metal layer is not peeled off. Referring to FIG. 4B, it shows a result of the scratch test for the bump structure embodied according to the comparative example of the present invention in which the gold strike plating is not applied, it may be observed that the gold metal layer is peeled off.

Figure 5A:
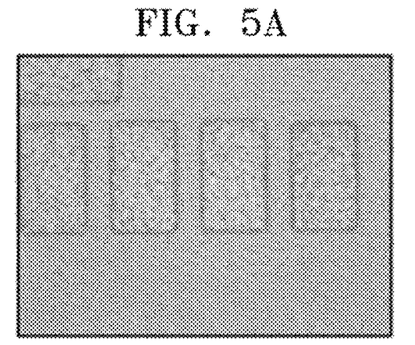
FIGS. 5A and 5B are images showing results of a tape detaching test in bump structures according to an embodiment and a comparative example of the present invention.
Figure 5B:
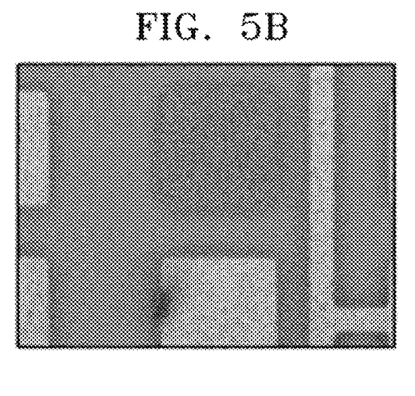

FIGS. 5A and 5B are images showing results of a tape detaching test in bump structures according to an embodiment and a comparative example of the present invention.

Referring to FIG. 5A, it shows a result of the tape detaching test for the bump structure embodied according to the embodiment of the present invention in which the gold strike plating is applied, it may be observed that the gold metal layer is not peeled off. Referring to FIG. 5B, it shows a result of the tape detaching test for the bump structure embodied according to the comparative example of the present invention in which the gold strike plating is not applied, it may be observed that the gold metal layer is peeled off.

The present invention is described with reference to the embodiments illustrated in the drawings, but the embodiments are merely illustrative. Therefore, it will be understood by those skilled in the art that various modifications and other equivalent embodiments can be made from the described embodiments. Hence, the real protective scope of the present invention shall be determined by the technical scope of the accompanying claims.

The invention claimed is:

1. A method for manufacturing a bump structure, the method comprising the steps of:
   forming an under bump metal (UBM) layer on a conductive pad;
   forming a copper bump on the UBM layer by electrolytic plating;

forming a nickel bump on the copper bump by electrolytic plating;

forming a first gold bump on the nickel bump by electrolytic plating using a first gold plating solution; and forming a second gold bump on the first gold bump by electrolytic plating using a second gold plating solution, wherein the second gold plating solution contains thallium (Tl) and the first gold plating solution is free of thallium.

2. The method of claim 1, wherein a gold content of the second gold plating solution is higher than a gold content of the first gold plating solution.

3. The method of claim 1, wherein: a gold content of the first gold plating solution ranges from 1 g/L to 4 g/L when the first gold plating solution contains $[Au(CN)_2]^-$; a gold content of the first gold plating solution ranges from 1 g/L to 4 g/L when the first gold plating solution contains $[Au(SO_3)_2]^{3-}$; a gold content of the second gold plating solution ranges from 4 g/L to 10 g/L when the second gold plating solution contains $[Au(CN)_2]^-$; and a gold content of the second gold plating solution ranges from 10 g/L to 15 g/L when the second gold plating solution contains $[Au(SO_3)_2]^{3-}$.

4. The method of claim 1, wherein a temperature of electrolytic plating using the first gold plating solution is lower than a temperature of electrolytic plating using the second gold plating solution.

5. The method of claim 1, wherein a temperature of electrolytic plating using the first gold plating solution ranges from 30° C. to 45° C., and a temperature of electrolytic plating using the second gold plating solution ranges from 40° C. to 60° C.

6. The method of claim 1, wherein the UBM layer comprises a Ti layer and a Cu layer on the Ti layer, or comprises a TiW layer and a Cu layer on the TiW layer.

7. The method of claim 1, wherein the copper bump has a height ranging from 1 μm to 20 μm, the nickel bump has a height ranging from 0.1 μm to 5 μm, and the first gold bump has a height ranging from 0.05 μm to 1 μm.

8. The method of claim 1, wherein: a thallium content of the second gold plating solution ranges from 3 mg/L to 6 mg/L when the second gold plating solution contains $[Au(CN)_2]^-$; and a thallium content of the second gold plating solution ranges from 3 mg/L to 25 mg/L when the second gold plating solution contains $[Au(SO_3)_2]^{3-}$.

9. A method for manufacturing a bump structure, the method comprising the steps of:

forming an under bump metal (UBM) layer on a conductive pad;

forming a copper bump on the UBM layer by electrolytic plating;

forming a nickel bump on the copper bump by electrolytic plating;

forming a first gold bump on the nickel bump by electrolytic plating using a first gold plating solution; and forming a second gold bump on the first gold bump by electrolytic plating using a second gold plating solution, wherein a thallium (Tl) content of the second gold plating solution is higher than a thallium content of the first gold plating solution.

10. The method of claim 9, wherein: a thallium content of the first gold plating solution is greater than 0 mg/L and equal to or less than 2 mg/L when the first gold plating solution contains $[Au(CN)_2]^-$; a thallium content of the first gold plating solution is greater than 0 mg/L and equal to or less than 2 mg/L when the first gold plating solution contains $[Au(SO_3)_2]^{3-}$; a thallium content of the second gold plating solution ranges from 3 mg/L and 6 mg/L when the second gold plating solution contains $[Au(CN)_2]^-$; and a thallium content of the second gold plating solution ranges from 3 mg/L and 25 mg/L when the second gold plating solution contains $[Au(SO_3)_2]^{3-}$.

11. The method of claim 9, wherein a gold content of the second gold plating solution is higher than a gold content of the first gold plating solution.

12. The method of claim 9, wherein: a gold content of the first gold plating solution ranges from 1 g/L to 4 g/L when the first gold plating solution contains $[Au(CN)_2]^-$; a gold content of the first gold plating solution ranges from 1 g/L to 4 g/L when the first gold plating solution contains $[Au(SO_3)_2]^{3-}$; a gold content of the second gold plating solution ranges from 4 g/L to 10 g/L when the second gold plating solution contains $[Au(CN)_2]^-$; and a gold content of the second gold plating solution ranges from 10 g/L to 15 g/L when the second gold plating solution contains $[Au(SO_3)_2]^{3-}$.

13. The method of claim 9, wherein a temperature of electrolytic plating using the first gold plating solution is lower than a temperature of electrolytic plating using the second gold plating solution.

14. The method of claim 9, wherein a temperature of electrolytic plating using the first gold plating solution ranges from 30° C. to 45° C., and a temperature of electrolytic plating using the second gold plating solution ranges from 40° C. to 60° C.

15. The method of claim 9, wherein the UBM layer comprises a Ti layer and a Cu layer on the Ti layer, or comprises a TiW layer and a Cu layer on the TiW layer.

16. The method of claim 9, wherein the copper bump has a height ranging from 1 μm to 20 μm, the nickel bump has a height ranging from 0.1 μm to 5 μm, and the first gold bump has a height ranging from 0.05 μm to 1 μm.

* * * * *